United States Patent
Son et al.

(10) Patent No.: US 10,749,135 B2
(45) Date of Patent: Aug. 18, 2020

(54) ELECTRODE STRUCTURE, ELECTRONIC DEVICE COMPRISING SAME AND METHOD FOR MANUFACTURING SAME

(71) Applicant: LG CHEM, LTD., Seoul (KR)

(72) Inventors: Yong Goo Son, Daejeon (KR); Song Ho Jang, Daejeon (KR); Jiehyun Seong, Daejeon (KR); Kiseok Lee, Daejeon (KR); Seung Heon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 38 days.

(21) Appl. No.: 16/303,974

(22) PCT Filed: Feb. 23, 2017

(86) PCT No.: PCT/KR2017/001976
§ 371 (c)(1),
(2) Date: Nov. 21, 2018

(87) PCT Pub. No.: WO2017/217639
PCT Pub. Date: Dec. 21, 2017

(65) Prior Publication Data
US 2019/0341574 A1   Nov. 7, 2019

(30) Foreign Application Priority Data

Jun. 17, 2016 (KR) .................. 10-2016-0075924

(51) Int. Cl.
*H01L 51/52* (2006.01)
*H01L 51/50* (2006.01)

(52) U.S. Cl.
CPC ...... *H01L 51/5228* (2013.01); *H01L 51/5096* (2013.01); *H01L 51/5212* (2013.01); *H01L 51/5234* (2013.01)

(58) Field of Classification Search
CPC . H01L 51/5212; H01L 51/5284; H01L 51/50; H01L 51/5203; H01L 51/5096
See application file for complete search history.

(56) References Cited

U.S. PATENT DOCUMENTS

| 5,133,989 A | 7/1992 | Numata et al. |
| 6,156,433 A | 12/2000 | Hatori et al. |
| 7,365,487 B2 | 4/2008 | Matsuura et al. |
| 7,714,508 B2 | 5/2010 | Chung |
| 2006/0255728 A1 | 11/2006 | Chung |

(Continued)

FOREIGN PATENT DOCUMENTS

| CN | 1862753 | 11/2006 |
| CN | 1892387 | 1/2007 |

(Continued)

*Primary Examiner* — Caridad Everhart
(74) *Attorney, Agent, or Firm* — Dentons US LLP

(57) ABSTRACT

Provided is an electrode structure having a transparent electrode, a light blocking pattern provided on the transparent electrode, an auxiliary electrode pattern provided on the light blocking pattern, and an organic insulating pattern covering the light blocking pattern and the auxiliary electrode pattern, wherein a line width of the light blocking pattern is larger than a line width of the auxiliary electrode pattern. Also provided are an electronic device including the electrode structure, and a method of manufacturing the electrode structure.

16 Claims, 7 Drawing Sheets

(56) References Cited

U.S. PATENT DOCUMENTS

| | | |
|---|---|---|
| 2006/0269849 A1 | 11/2006 | Lee |
| 2007/0002199 A1 | 1/2007 | Fujikawa et al. |
| 2007/0111412 A1 | 5/2007 | Oh et al. |
| 2010/0133974 A1 | 6/2010 | Cho et al. |
| 2011/0123927 A1 | 5/2011 | Park et al. |
| 2011/0204370 A1* | 8/2011 | Yoon ............... H01L 27/1214 257/59 |
| 2013/0093316 A1 | 4/2013 | Sakaguchi |
| 2014/0014952 A1 | 1/2014 | Katsui et al. |
| 2014/0034364 A1 | 2/2014 | Kang et al. |
| 2014/0077171 A1 | 3/2014 | Yamakita et al. |
| 2014/0284590 A1 | 9/2014 | Nakazawa et al. |
| 2014/0361256 A1 | 12/2014 | Kim et al. |
| 2015/0262528 A1* | 9/2015 | Takahara ............ G09G 3/3225 345/212 |
| 2016/0174383 A1 | 6/2016 | Kang et al. |
| 2016/0190455 A1 | 6/2016 | Moon et al. |

FOREIGN PATENT DOCUMENTS

| | | |
|---|---|---|
| CN | 102099741 | 6/2011 |
| CN | 105453191 | 3/2016 |
| EP | 0945887 A2 | 9/1999 |
| EP | 1724807 A2 | 11/2006 |
| EP | 2262349 A1 | 12/2010 |
| JP | H04272634 | 9/1992 |
| JP | H05343683 | 12/1993 |
| JP | H07102646 | 11/1995 |
| JP | 10092325 | 4/1998 |
| JP | H10116558 | 5/1998 |
| JP | H11273578 | 10/1999 |
| JP | 2001230086 | 8/2001 |
| JP | 2005268062 | 9/2005 |
| JP | 2006318901 | 11/2006 |
| JP | 2007142388 | 6/2007 |
| JP | 2007-305683 | 11/2007 |
| JP | 2012142249 | 7/2012 |
| JP | 5315468 | 10/2013 |
| JP | 2015135821 | 7/2015 |
| KR | 10-2005-0121930 | 12/2005 |
| KR | 10-0555311 | 3/2006 |
| KR | 10-2006-0117491 | 11/2006 |
| KR | 10-0726648 | 6/2007 |
| KR | 10-0922800 | 10/2009 |
| KR | 10-1161301 | 7/2012 |
| KR | 10-2014-0144609 | 12/2014 |
| KR | 10-2015-0037707 | 4/2015 |
| WO | 2011155306 | 8/2013 |
| WO | 2013062059 | 4/2015 |

* cited by examiner

[Figure 1]
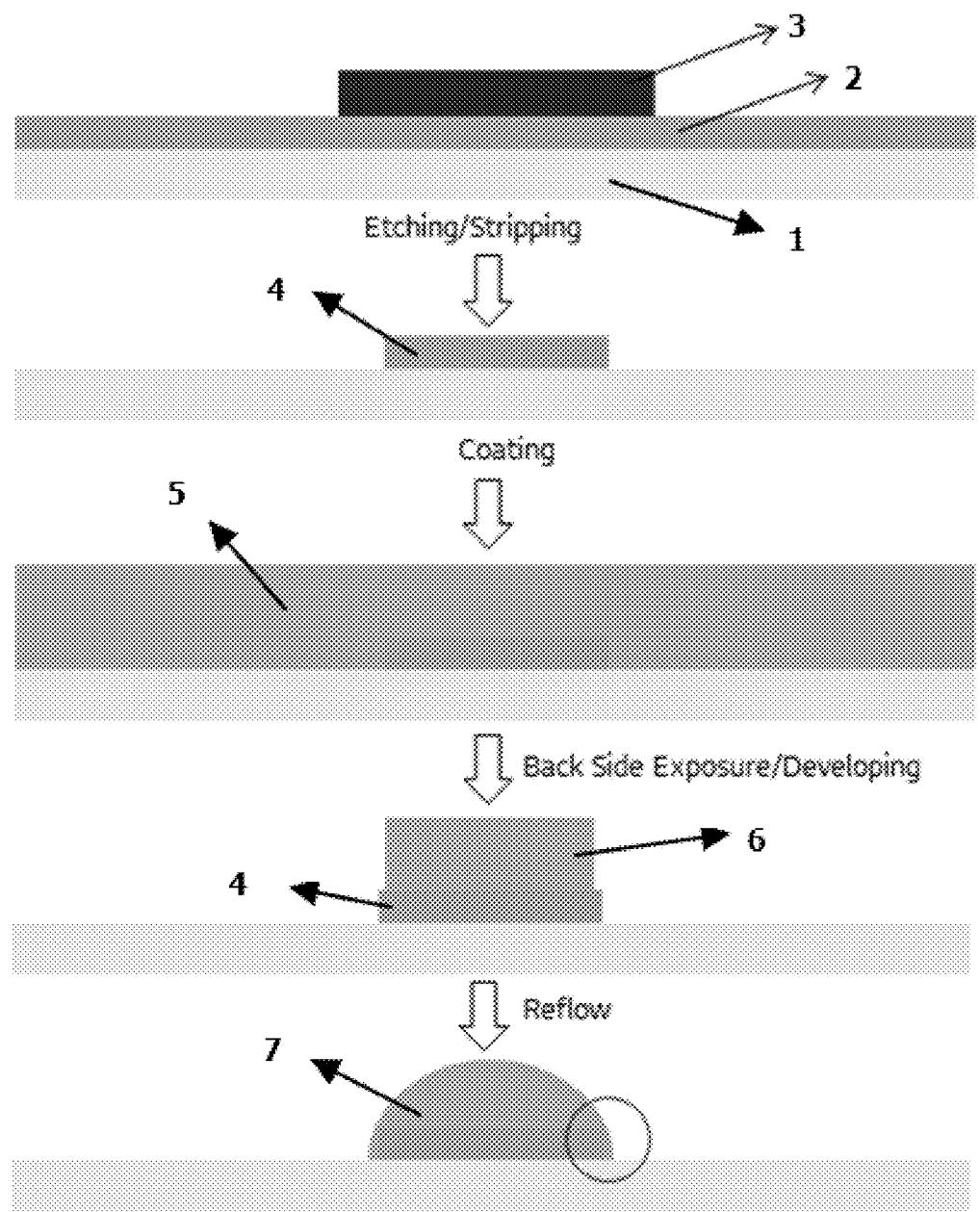

[Figure 2]
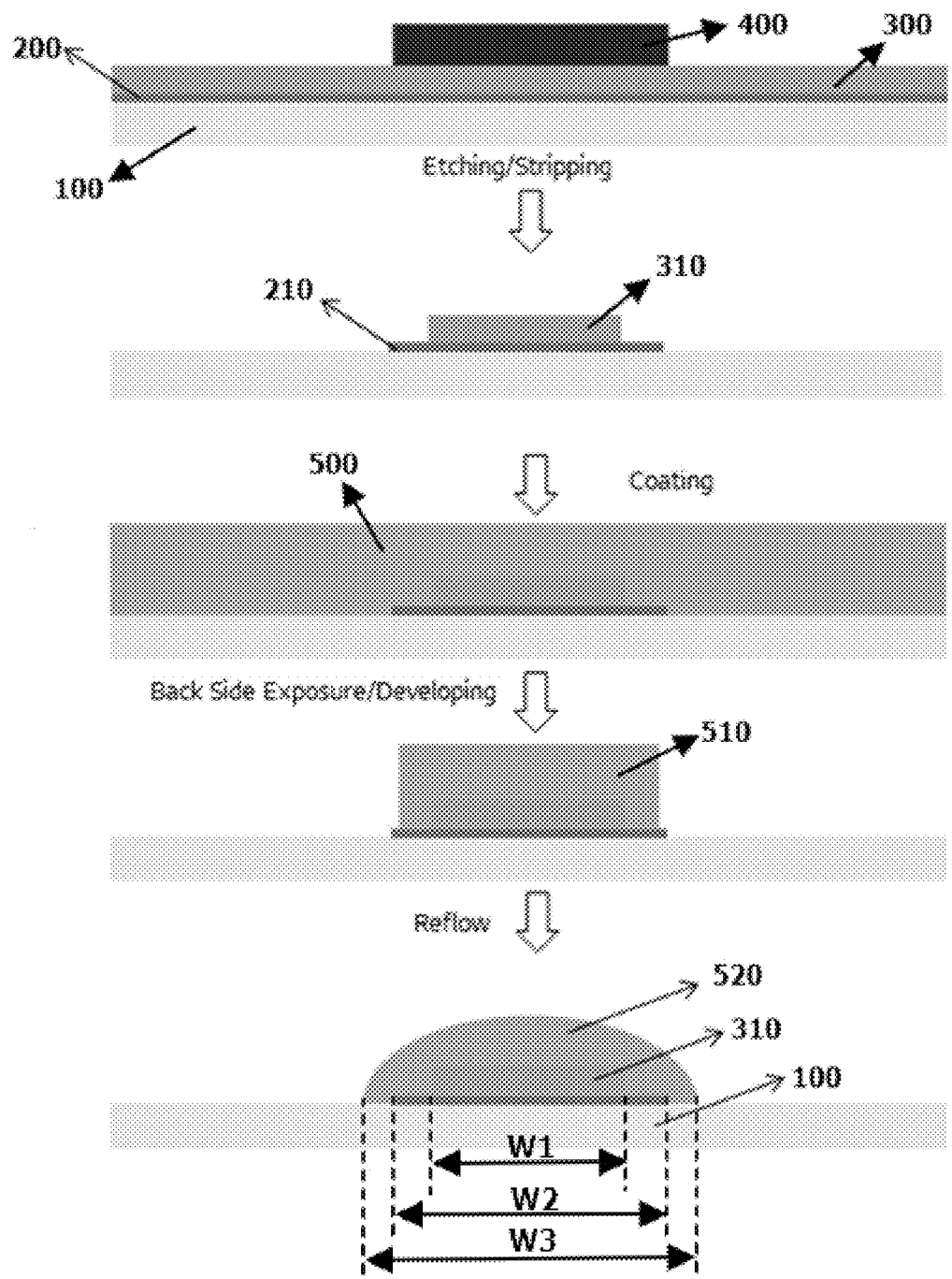

[Figure 3]
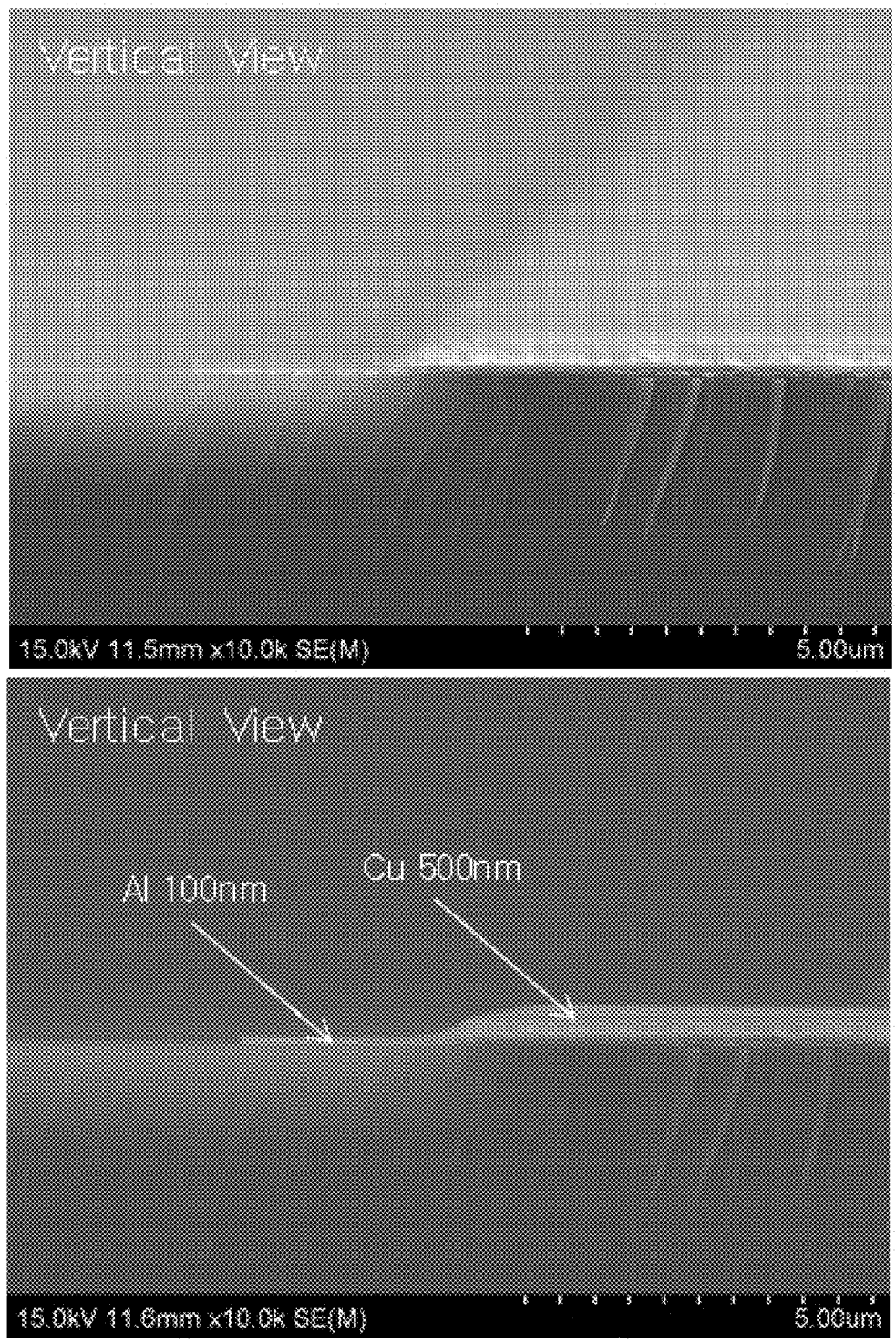

[Figure 4]
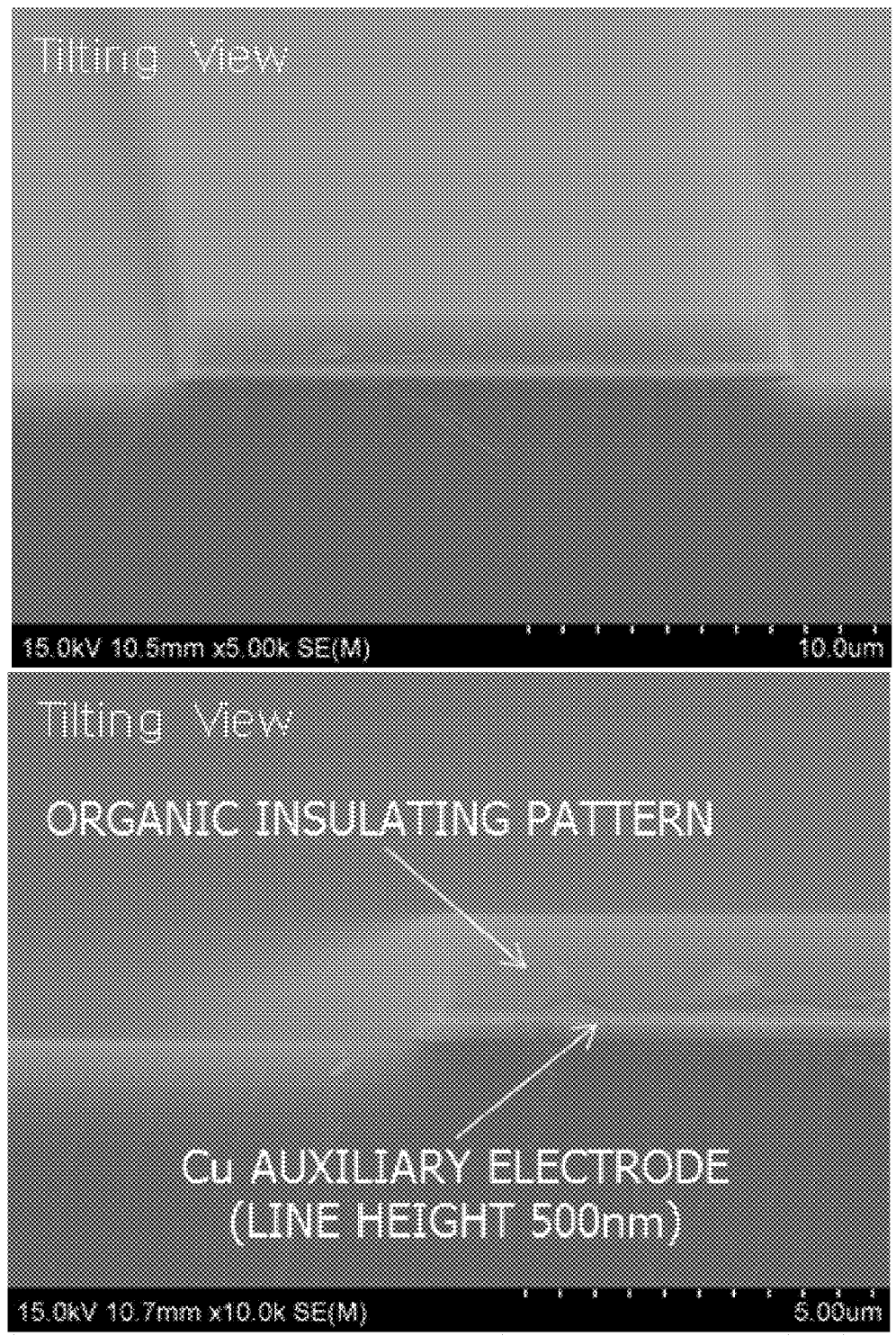

[Figure 5]
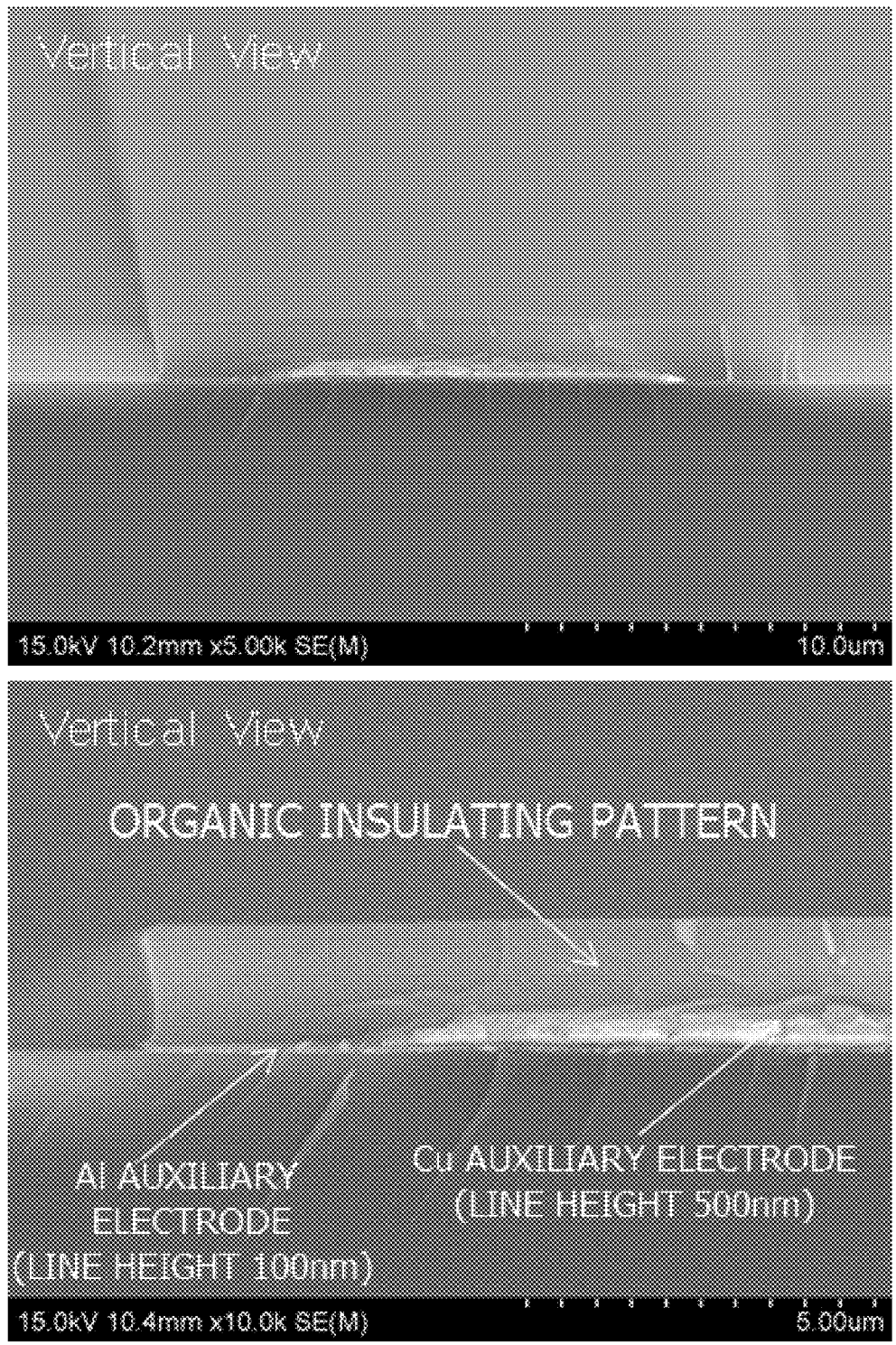

[Figure 6]
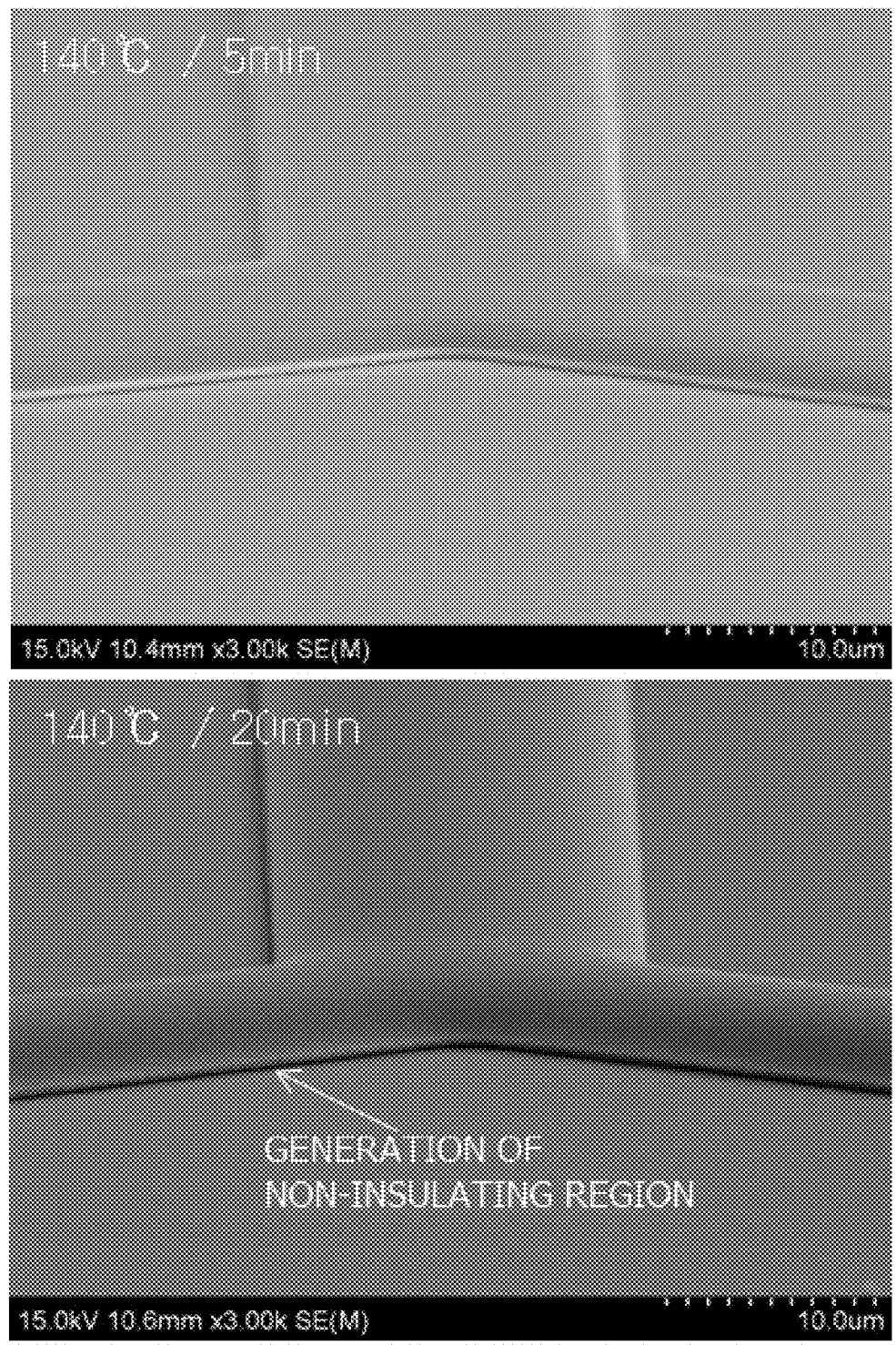

[Figure 7]
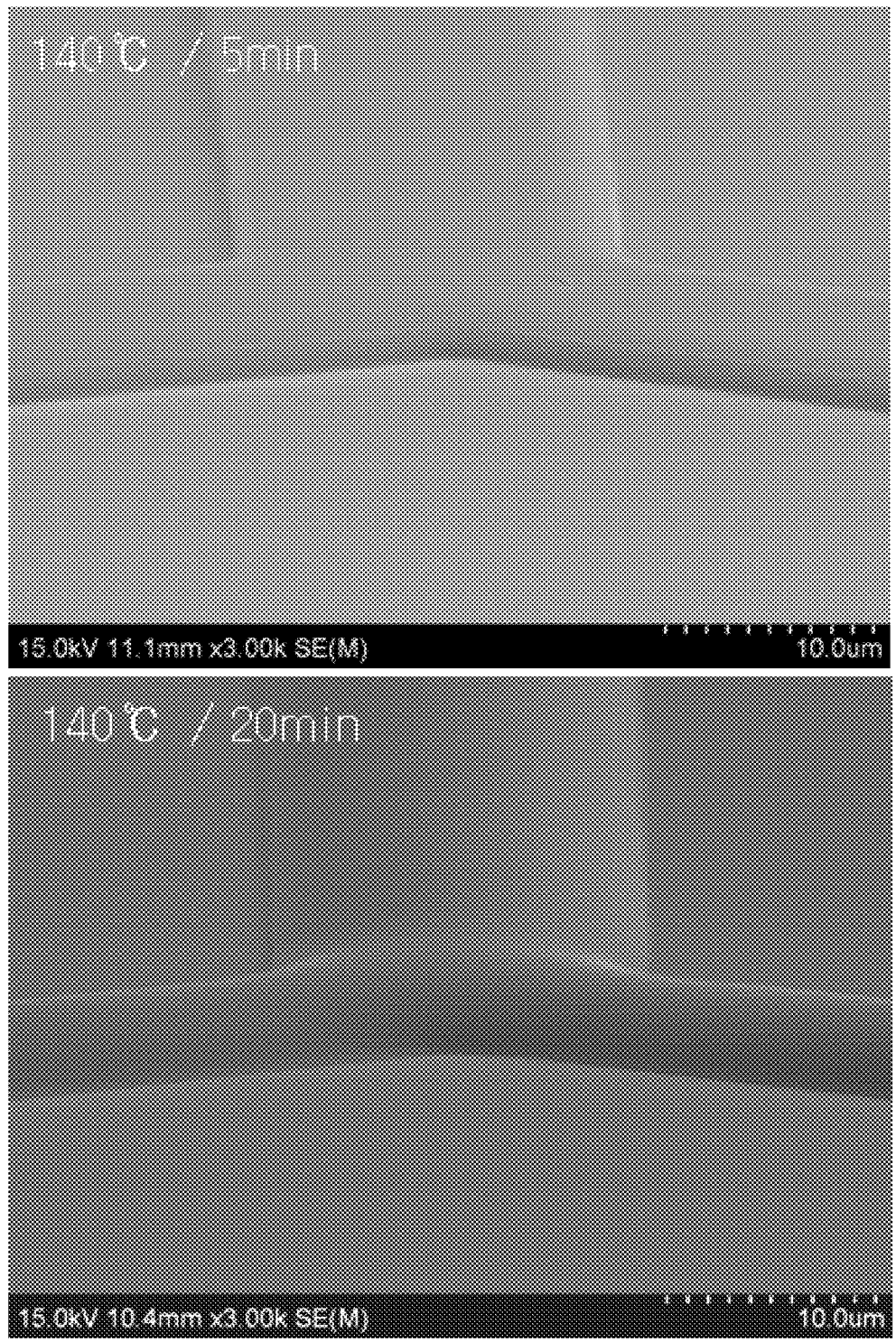

ELECTRODE STRUCTURE, ELECTRONIC DEVICE COMPRISING SAME AND METHOD FOR MANUFACTURING SAME

This application is a National Stage Application of International Application No. PCT/KR2017/001976 filed on Feb. 23, 2017, which claims priority to and the benefit of Korean Patent Application No. 10-2016-0075924 filed in the Korean Intellectual Property Office on Jun. 17, 2016, the entire contents of which are incorporated herein by reference.

TECHNICAL FIELD

The present specification relates to an electrode structure, an electronic device including the electrode structure, and a method of manufacturing the electrode structure.

BACKGROUND ART

Recently, demands for a product, in which a transparent electrode is applied to a region of an effective screen part, in an electronic device, such as a display or a touch panel, are increased, and to this end, a metal oxide-series transparent conductive layer, such as an ITO, an IZO, and a ZnO, is used, but the transparent conductive layer based on the metal oxide has low endogenetic conductivity of the material itself and thus has a fetal problem in making the electronic device be large. Particularly, in developing an OLED lighting device which is recently getting the spotlight, due to a high resistance characteristic of a transparent electrode based on an oxide, there is a problem in that when a size of the device is increased, non-uniformity of the quantity of current is caused by a carrier crowding phenomenon. The problem causes a sharp decrease in brightness uniformity and induces the local generation of high heat during an operation of the device to decrease a life of the device due to thermal degradation of an organic material.

In order to solve the problem, a technology for an auxiliary electrode pattern that is a metal electrode having low resistance together with a transparent electrode based on an oxide is developed.

DETAILED DESCRIPTION OF THE INVENTION

Technical Problem

The present specification provides an electrode structure, an electronic device including the electrode structure, and a method of manufacturing the electrode structure.

Technical Solution

The present specification provides an electrode structure including: a transparent electrode; a light blocking pattern provided on the transparent electrode; an auxiliary electrode pattern provided on the light blocking pattern; and an organic insulating pattern covering the light blocking pattern and the auxiliary electrode pattern, in which a line width of the light blocking pattern is larger than a line width of the auxiliary electrode pattern.

Further, the present specification provides an electronic device including the electrode structure.

Further, the present specification provides a method of manufacturing the electrode structure, the method including forming an electrode structure, in which the light blocking pattern, the auxiliary electrode pattern, and the organic insulating pattern are sequentially provided on the transparent electrode.

Advantageous Effects

According to the present invention, it is possible to easily implement an organic insulating pattern having a form surrounding a metal auxiliary electrode pattern.

BRIEF DESCRIPTION OF DRAWINGS

FIG. 1 is a flowchart illustrating a process of forming an auxiliary electrode pattern and an insulating pattern in the related art.

FIG. 2 is a flowchart illustrating a process of forming a light blocking pattern, an auxiliary electrode pattern, and an insulating pattern according to an exemplary embodiment of the present specification.

FIG. 3 is an image of a scanning electron microscope (SEM) of a light blocking pattern and an auxiliary electrode pattern formed in Example 1.

FIG. 4 is an image of an SEM of an organic insulating pattern precursor formed on an auxiliary electrode pattern in Comparative Example 1.

FIG. 5 is an image of an SEM of an organic insulating pattern precursor formed on a light blocking pattern and an auxiliary electrode pattern in Example 1.

FIG. 6 is an image of an SEM of the organic insulating pattern precursor reflowing for five minutes or 20 minutes in Comparative Example 1.

FIG. 7 is an image of an SEM of the organic insulating pattern precursor reflowing for five minutes or 20 minutes in Example 1.

EXPLANATION OF REFERENCE NUMERALS AND SYMBOLS

1: Transparent electrode
2: Auxiliary electrode layer
3: Etching protecting pattern
4: Auxiliary electrode pattern
5: Organic insulating precursor layer
6: Precursor of organic insulating pattern
7: Organic insulating pattern
100: Transparent electrode
200: Light blocking layer
210: Light blocking pattern
300: Auxiliary electrode layer
310: Auxiliary electrode pattern
400: Etching protecting pattern
500: Organic insulating precursor layer
510: Precursor of organic insulating pattern
520: Organic insulating pattern
W1: Line width of auxiliary electrode pattern
W2: Line width of light blocking pattern
W3: Line width of organic insulating pattern

BEST MODE

Hereinafter, the present specification will be described in detail.

The present specification provides an electrode structure including: a transparent electrode; a light blocking pattern provided on the transparent electrode; an auxiliary electrode pattern provided on the light blocking pattern; and an organic insulating pattern covering the light blocking pattern and the auxiliary electrode pattern.

The transparent electrode is not particularly limited as long as the transparent electrode has transparency in which the predetermined quantity or more of light may permeate, and for example, the transparent electrode may be an oxide-based transparent electrode layer, a thin metal layer, a metal oxide pattern, or a metal pattern. Particularly, the transparent electrode may be an oxide-based transparent electrode layer.

The oxide-based transparent electrode layer may include a transparent metal oxide, and for example, the oxide-based transparent electrode layer may include at least one of a zinc oxide, an indium oxide, a tin oxide, an indium-tin oxide (ITO), and an indium zinc oxide (IZO).

A thickness of the transparent electrode is not particularly limited as long as the transparent electrode has transparency in which the predetermined quantity or more of light may permeate, and particularly, a thickness of the transparent electrode may be 10 nm or more and 500 nm or less.

The light blocking pattern is formed of a material which is capable of blocking light, and as long as the material is capable of blocking light and is an easy material for forming a pattern, the material is not particularly limited, and the light blocking pattern may be formed of a material generally used in the art. For example, the light blocking pattern may be a metal pattern or a conductive polymer pattern, and preferably, may be a metal pattern. In this case, the metal pattern means a pattern including a metal, and may include a metal oxide, a metal nitride, and the like as well as pure metal.

A line width W2 of the light blocking pattern may be larger than a line width W1 of the auxiliary electrode pattern. Particularly, a line width of the light blocking pattern may be larger than a line width of the auxiliary electrode pattern by 0.5 µm or more, and more particularly, a line width of the light blocking pattern may be larger than a line width of the auxiliary electrode pattern by 0.5 µm or more and 10 µm or less.

When a line width of the light blocking pattern is larger than a line width of the auxiliary electrode pattern, the line width of the light blocking pattern is not particularly limited, but particularly, the line width of the light blocking pattern may be 2.0 µm or more and 1.0 mm or less.

The light blocking pattern may have a minimum thickness in which light may be blocked during exposure, and particularly, a thickness of the light blocking pattern may be 100 nm or less, and more particularly, a thickness of the light blocking pattern may be 20 nm or more and 100 nm or less.

In order for the auxiliary electrode to be electrically connected with the transparent electrode to serve to decrease resistance, the light blocking pattern provided between the transparent electrode and the auxiliary electrode may have electric conductivity.

The light blocking pattern and the auxiliary electrode pattern may include different metals. Particularly, the light blocking pattern and the auxiliary electrode pattern may include metals of which etching speeds for an etchant are different from each other.

The light blocking pattern and the auxiliary electrode pattern may be different from each other, and may independently include chrome (Cr), molybdenum (Mo), aluminum (Al), copper (Cu), silver (Ag), and an alloy thereof. Particularly, the light blocking pattern may include aluminum and the auxiliary electrode pattern may include copper, and more particularly, the light blocking pattern may be formed of aluminum and the auxiliary electrode pattern may be formed of copper.

A thickness of the auxiliary electrode pattern is not particularly limited, but when a thickness of the auxiliary electrode pattern is increased, resistance is further decreased. In the present specification, there is an advantage in that even though a thickness of the auxiliary electrode pattern is increased, the auxiliary electrode pattern is easily insulated. A thickness of the auxiliary electrode pattern may be 100 nm or more and 2 µm or less, and particularly, 300 nm or more and 500 nm or less.

When a line width of the auxiliary electrode pattern is smaller than a line width of the light blocking pattern, the line width of the auxiliary electrode pattern is not particularly limited, but particularly, the line width of the auxiliary electrode pattern may be 1.5 µm or more and 1 mm or less.

A form of the auxiliary electrode pattern is not particularly limited, and a form, which is not viewed by the eyes of a user or does not distort light by the auxiliary electrode pattern, is preferable. In order to minimize diffraction/interference, an irregular pattern is advantageous, but the irregular pattern may be viewed by the eyes of the user as if being biased to one side, so that the auxiliary electrode pattern may be a homogeneous pattern in which regularity and irregularity are appropriately harmonized.

When points for forming the auxiliary electrode pattern are disposed, a predetermined size of area is designated as a basic unit in an area, in which the pattern is to be put, the points are irregularly disposed while the number of points within the basic unit is uniformly adjusted, and the points are connected to form a homogeneous pattern in which regularity and irregularity are appropriately harmonized. The method of forming the pattern by connecting the homogeneously disposed points is not particularly limited, but for example, the points for forming the auxiliary electrode pattern may be connected by using a Voronoi diagram generator or a Delaunay pattern generator to form the pattern.

The light blocking pattern and the organic insulating pattern are provided in response to the auxiliary electrode pattern. Particularly, the light blocking pattern and the organic insulating pattern have the same form as that of the auxiliary electrode pattern, but are provided in a state where only the line widths of the light blocking pattern and the organic insulating pattern are larger than that of the auxiliary electrode pattern.

A line width W3 of the organic insulating pattern may be larger than the line width W2 of the light blocking pattern. Particularly, a line width of the organic insulating pattern may be larger than a line width of the light blocking pattern by 0.5 µm or more, and more particularly, a line width of the organic insulating pattern may be larger than a line width of the light blocking pattern by 0.5 µm or more and 2 µm or less.

A length of the shortest line connected from one point among the corners of the light blocking pattern to an opposite surface of a surface that is in contact with the light blocking pattern of the organic insulating pattern may be 0.5 µm or more. In this case, the light blocking pattern may secure insulation stability by the organic insulating pattern.

A length of the shortest line connected from one point among the corners of the auxiliary electrode pattern to an opposite surface of a surface that is in contact with the auxiliary electrode pattern of the organic insulating pattern may be 0.5 µm or more. In this case, the auxiliary electrode pattern may secure insulation stability by the organic insulating pattern.

The opposite surface of the surface of the organic insulating pattern that is in contact with the light blocking pattern and the auxiliary electrode pattern may be a curved surface. In this case, the curved surface means a streamline shape surface having no angular part.

The organic insulating pattern may include at least one of a novolac-based polymer, a poly hydroxyl styrene-based polymer, a polyimide-based polymer, an acryl-based polymer, and a poly siloxane-based polymer, and particularly, the organic insulating pattern may include a polyimide-based polymer.

When a thickness of the auxiliary electrode pattern is increased, resistance is further decreased, so that when the auxiliary electrode pattern is formed to be thick, there is a problem in that the insulating pattern cannot completely cover the auxiliary electrode pattern or the auxiliary electrode pattern is not formed with the thickness in which insulation stability is secured. Particularly, as illustrated in FIG. 1, the insulating pattern may not cover the auxiliary electrode pattern with a sufficient thickness, in which insulation stability is secured, due to a step of the auxiliary electrode pattern. The auxiliary electrode pattern is not covered by the insulation pattern, so that an exposed surface of the auxiliary electrode pattern may be generated as illustrated in the image of the SEM of FIG. 6.

However, the insulation pattern of the present specification has an advantage in stably insulating the auxiliary electrode pattern regardless of a thickness of the auxiliary electrode pattern.

The light blocking pattern may have a thickness of 100 nm or less and electric conductivity, and the light blocking pattern and the auxiliary electrode pattern may be different from each other and independently include chrome (Cr), molybdenum (Mo), aluminum (Al), copper (Cu), silver (Ag), and an alloy thereof, and the organic insulating pattern may include a polyimide-based polymer and has a larger line width than that of the light blocking pattern, and the opposite surface of the surface that is in contact with the light blocking pattern and the auxiliary electrode pattern of the organic insulating pattern may be a curved surface. In this case, even though a thickness of the auxiliary electrode pattern is increased, the organic insulating pattern may stably insulate the auxiliary electrode pattern.

The present specification provides an electronic device including the electrode structure.

As long as the electronic device includes the electrode structure, the electronic device is not particularly limited, but the electronic device may be any one of a plasma display panel (PDP), a light emitting diode (LED), an organic light emitting diode (OLED), a liquid crystal display (LCD), a color filter on thin film transistor-liquid crystal display (COT-LCD), a thin film transistor-liquid crystal display (LCD-TFT), and a cathode ray tube (CRT).

The present specification provides a display device including the electrode structure.

The present specification provides a lighting device including the electrode structure. The lighting device may be a white lighting device or a color lighting device.

The present specification provides a method of manufacturing the electrode structure, the method including forming the electrode structure, in which the light blocking pattern, the auxiliary electrode pattern, and the organic insulating pattern are sequentially provided on the transparent electrode.

The method of manufacturing the electrode structure may quote the description of the electrode structure.

The forming of the electrode structure may include: S1) forming the light blocking pattern and the auxiliary electrode pattern on the transparent electrode; and S2) forming the organic insulating pattern covering the light blocking pattern and the auxiliary electrode pattern.

In operation S1), the method of forming each of the light blocking pattern and the auxiliary electrode pattern on the transparent electrode is not particularly limited as long as the method may form the light blocking pattern and the auxiliary electrode pattern on the transparent electrode, and for example, the method may be a roll-printing method, an inkjet printing method, a screen printing method, a deposition method, a photolithography method, and an etching method, and the like, and an etching method is preferable.

Operation S1) may include: S1-1) forming a light blocking layer on the transparent electrode; S1-2) forming an auxiliary electrode layer on the light blocking layer; S1-3) forming an etching protecting pattern on the auxiliary electrode layer; and S1-4) forming the light blocking pattern and the auxiliary electrode pattern by removing portions of the light blocking layer and the auxiliary electrode layer, in which the etching protecting pattern is not formed, through one or more times of an etching process.

In operation S1-1), the method of forming the light blocking layer is not particularly limited, and the light blocking layer may be formed by a method generally used in the art. Particularly, the method of forming the light blocking layer may be any one of a plating deposition method, a sputter deposition method, and an evaporator deposition method.

In operation S1-1), a composition for the light blocking layer may include at least one of chrome (Cr), molybdenum (Mo), aluminum (Al), copper (Cu), silver (Ag), and an alloy thereof, and particularly, may include at least one of aluminum (Al), molybdenum (Mo), chrome (Cr), and an alloy thereof.

In operation S1-2), the method of forming the auxiliary electrode layer is not particularly limited, and the auxiliary electrode layer may be formed by a method generally used in the art. Particularly, the method of forming the auxiliary electrode layer may be any one of a plating deposition method, a sputter deposition method, and an evaporator deposition method.

In operation S1-2), a composition for the auxiliary electrode layer may include at least one of chrome (Cr), molybdenum (Mo), aluminum (Al), copper (Cu), silver (Ag), and an alloy thereof, and particularly, may include at least one of copper (Cu), aluminum (Al), silver (Ag), and an alloy thereof.

In operation S1-3), the method of forming the etching protecting pattern is not particularly limited, and the etching protecting pattern may be formed by a method generally used in the art. Particularly, the method of forming the etching protecting pattern may be any one of a roll printing method, an inkjet printing method, a screen printing method, and a photolithography method.

In operation S1-3), the method of forming the etching protecting pattern may include a method of directly forming the etching protecting pattern on the auxiliary electrode layer by using a composition for the etching protecting pattern, or a method of forming an etching protecting layer on the auxiliary electrode layer by using a composition for the etching protecting pattern and developing the etching protecting layer to form the pattern.

In operation S1-3), the composition for the etching protecting pattern may include an etching resistant polymer and a solvent. The etching resistant polymer may include at least one of a novolac-based polymer and a poly hydroxyl styrene-based polymer.

When the etching protecting pattern is formed by using light, a composition, which is capable of assigning photosensitivity to the composition for the etching protecting pattern may be added. For example, the composition for the etching protecting pattern may further include at least one of a cross linking agent, a diazonaphtho quinone-series photoactive material, and an initiator.

The composition for the etching protecting pattern may be a positive photosensitive material composition or a negative photosensitive material composition, and is not specially limited.

The solvent, the cross linking agent, and the initiator are not specially limited, and may adopt a solvent, a cross linking agent, and an initiator generally used in the art.

In operation S1-4), the patterns may be formed by a one-time etching process with a collective etchant, or the patterns may be formed by two or more times of etching process with two or more kinds of etchant. Preferably, operation S1-4) may be an operation of forming the light blocking pattern and the auxiliary electrode pattern by removing the portions of the light blocking layer and the auxiliary electrode layer, in which the etching protecting pattern is not formed, by a one-time etching process with collective etchant. In this case, a line width of the light blocking pattern may be larger than a line width of the auxiliary electrode pattern by a difference in an etching speed of the light blocking layer and the auxiliary electrode layer with respect to the collective etchant.

As long as the etchant may etch each of the light blocking layer and the auxiliary electrode layer, the etchant is not particularly limited, but an etchant generally used in the art may be selected according to the materials of the light blocking layer and the auxiliary electrode layer.

As long as the collective etchant may etch both the light blocking layer and the auxiliary electrode layer, the collective etchant is not particularly limited, but a use of an etchant generally used in the art may be selected according to the materials of the light blocking layer and the auxiliary electrode layer. The collective etchant may include at least one of a mixed acid etchant, in which phosphoric acid, nitric acid, and acetic acid are mixed; an iron chloride-series etchant; a copper chloride-series etchant; a sulfuric acid hydrogen peroxide mixture-based etchant; a hydrochloric acid-based etchant; and an organic acid-series etchant.

When the light blocking layer is formed of aluminum and the auxiliary electrode layer is formed of copper, the collective etchant which is capable of etching both aluminum and copper may be any one of a mixture acid-based etchant, in which phosphoric acid, nitric acid, and acetic acid are mixed, and an iron chloride-series etchant.

Operation S2) may include: S2-1) forming a photosensitive organic insulating layer on a surface provided with the light blocking pattern and the auxiliary electrode pattern of the transparent electrode; S2-2) performing an exposure by irradiating light from an opposite surface of the surface provided with the photosensitive organic insulating layer of the transparent electrode; S2-3) forming a precursor of the organic insulating pattern on the surface provided with the light blocking pattern and the auxiliary electrode pattern of the transparent electrode, by developing the exposed photosensitive organic insulating layer; and S2-4) performing a reflow for forming the organic insulating pattern covering the light blocking pattern and the auxiliary electrode pattern by heating the precursor of the organic insulating pattern.

Operation S2-1) is an operation of forming a photosensitive organic insulating layer by using a composition for a photosensitive organic insulating layer on a surface provided with the light blocking pattern and the auxiliary electrode pattern of the transparent electrode.

In operation S2-1), the method of forming the photosensitive organic insulating layer is not particularly limited, and the photosensitive organic insulating layer may be formed by a method generally used in the art. Particularly, the method of forming the photosensitive organic insulating layer may be any one of a dip coating method, a spray coating method, a spin coating method, and a slit coating method.

In operation S2-1), the composition for the photosensitive organic insulating layer may include an insulating polymer, a diazonaphtho quinone-series photoactive material, and a solvent, and the composition for the photosensitive organic insulating layer may be a positive photosensitive material composition.

The insulating polymer is not particularly limited, but for example, the insulating polymer may include at least one of a novolac-based polymer, a poly hydroxyl styrene-based polymer, a polyimide-based polymer, an acryl-based polymer, and a poly siloxane-based polymer.

In operation S2-2), in the performing of the exposure, the exposure is performed by irradiating light to the transparent electrode, and particularly, light is radiated to the opposite surface of the surface provided with the photosensitive organic insulating layer of the transparent electrode so that light may be selectively exposed to the photosensitive organic insulating layer by the light blocking pattern on the substrate.

In the performing of the exposure, light is radiated to the opposite surface of the surface provided with the light blocking pattern and the photosensitive organic insulating layer of the transparent electrode, so that light permeates only a region, in which the light blocking pattern is not formed, and thus a part of the photosensitive organic insulating layer formed in the region, in which the light blocking pattern is not formed, may be exposed by the permeating light.

The part of the photosensitive organic insulating layer exposed by the light in the performing of the exposure may be changed to have a property developed by a developer.

The exposure condition may be adjusted according to a property of the composition for the applied photosensitive organic insulating layer, and is not particularly limited.

Operation S2-3) is an operation, in which a part of the exposed photosensitive organic insulating layer exposed to light by the developer is removed to form a precursor of the organic insulating pattern on the light blocking pattern.

As long as the developer is capable of developing the exposed photosensitive organic insulating layer, the developer is not particularly limited, and a developer generally used in the art may be adopted.

In operation S2-4), as long as a temperature for heating the precursor of the organic insulating pattern heats the precursor of the organic insulating pattern so that the light blocking pattern and the auxiliary electrode pattern are covered, the temperature is not particularly limited, but particularly, the temperature may be 130° C. or more and 250° C. or less.

Operation S2 may further include S2-5) curing the organic insulating pattern.

A temperature of curing the organic insulating pattern is not particularly limited, but particularly, the temperature may be 130° C. or more and 250° C. or less.

The method of manufacturing the electrode structure may further include forming the transparent electrode on the substrate before operation S1-1).

The method of forming the transparent electrode is not particularly limited, but may be any one of a sputter deposition method and a chemical vapor deposition method.

The forming of the electrode structure may include: S1-1) forming a light blocking layer on the transparent electrode; S1-2) forming an auxiliary electrode layer on the light blocking layer; S1-3) forming an etching protecting pattern on the auxiliary electrode layer; S1-4) forming the light blocking pattern and the auxiliary electrode pattern by removing portions of the light blocking layer and the auxiliary electrode layer, in which the etching protecting pattern is not formed, through a one-time etching process by using collective etchant; S2-1) forming a photosensitive organic insulating layer on a surface provided with the light blocking pattern and the auxiliary electrode pattern of the transparent electrode; S2-2) performing exposure of irradiating light from an opposite surface of the surface provided with the photosensitive organic insulating layer of the transparent electrode; S2-3) forming a precursor of an organic insulating pattern on the surface provided with the light blocking pattern and the auxiliary electrode pattern of the transparent electrode, by developing the exposed photosensitive organic insulating layer; S2-4) performing a reflow of forming the organic insulating pattern covering the light blocking pattern and the auxiliary electrode pattern by heating the precursor of the organic insulating pattern; and S2-5) curing the organic insulating pattern.

MODE FOR CARRYING OUT THE INVENTION

Hereinafter, the present specification will be described in more detail with reference to the Examples. However, the following Examples are set forth to illustrate the present specification, but do not intend to limit the present specification.

EXAMPLE

Example 1

An aluminum layer (light blocking layer) having a thickness of 100 nm was formed on an ITO film having a thickness of 23 nm by a sputter deposition method, and a copper layer (auxiliary electrode layer) having a thickness of 500 nm was formed on the aluminum layer by an evaporation deposition method.

An etching protecting pattern was formed on the copper layer by a reverse offset printing process by using a composition for the etching protecting pattern based on a novolac resin.

An aluminum pattern and a copper pattern was formed by removing portions of the aluminum layer and the copper layer, in which the etching protecting pattern is not formed, by using a mixed acid etchant, in which phosphoric acid, nitric acid, and acetic acid are mixed, and the copper pattern was additionally etched by using a sulfuric acid hydrogen peroxide mixture-based copper etchant. In this case, it can be seen that a line width of the aluminum pattern is larger than that of the copper pattern through FIG. 3.

A photosensitive polyimide layer was formed by using a photosensitive polyimide composition on the aluminum pattern and the copper pattern, and then light was radiated from an opposite surface of a surface provided with the aluminum pattern and the copper pattern of the ITO film.

After the exposure, the photosensitive polyimide layer was developed with a developer of 2.38 wt % of tetramethylammonium hydroxide (TMAH) to form an organic insulating pattern precursor.

Comparative Example 1

Except that an aluminum layer (light blocking layer) is not formed, an organic insulating pattern precursor was identically manufactured to Example 1. It can be seen that the organic insulating pattern precursor formed on a copper pattern by using a copper pattern (auxiliary electrode pattern) as a light blocking pattern has a smaller line width than that of the copper pattern.

Experimental Example 1

Results of a reflow of the organic insulating pattern precursors formed in Example 1 and Comparative Example 1 at 140° C. for five minutes or 20 minutes are illustrated in FIGS. 6 and 7, respectively.

Referring to FIGS. 6 and 7, in Example 1, it can be seen that the aluminum pattern and the copper pattern are covered in five minutes and the organic insulating pattern precursor flows down after 20 minutes to be formed with a curved surface, but in Comparative Example 1, it can be seen that the copper pattern is not completely covered even after 20 minutes, so that a non-insulating region is generated.

The invention claimed is:

1. An electrode structure, comprising:
   a transparent electrode;
   a light blocking pattern provided on the transparent electrode;
   an auxiliary electrode pattern having a thickness of from 100 nm to 2 μm provided on the light blocking pattern; and
   an organic insulating pattern covering the light blocking pattern and the auxiliary electrode pattern,
   wherein a line width of the light blocking pattern is larger than a line width of the auxiliary electrode pattern.

2. The electrode structure of claim 1, wherein a line width of the organic insulating pattern is larger than a line width of the light blocking pattern.

3. The electrode structure of claim 1, wherein a thickness of the light blocking pattern is 100 nm or less.

4. The electrode structure of claim 1, wherein the light blocking pattern has electric conductivity.

5. The electrode structure of claim 1, wherein the light blocking pattern and the auxiliary electrode pattern include different metals.

6. The electrode structure of claim 1, wherein the light blocking pattern and the auxiliary electrode pattern are different from each other, and independently include a metal selected from among chrome (Cr), molybdenum (Mo), aluminum (Al), copper (Cu), silver (Ag), and an alloy thereof.

7. The electrode structure of claim 1, wherein:
   a first surface of the organic insulating pattern is in contact with the light blocking pattern and the auxiliary electrode pattern; and
   a second surface of the organic insulating pattern opposite of the first surface is a curved surface.

8. The electrode structure of claim 1, wherein the organic insulating pattern includes a polyimide-based polymer.

9. The electrode structure of claim 1, wherein:
   the light blocking pattern has a thickness of 100 nm or less, and has electric conductivity;

the light blocking pattern and the auxiliary electrode pattern are different from each other, and independently include a metal selected from among chrome (Cr), molybdenum (Mo), aluminum (Al), copper (Cu), silver (Ag), and an alloy thereof;

the organic insulating pattern includes a polyimide-based polymer and has a larger line width than the line width of the light blocking pattern; and a first surface of the organic insulating pattern is in contact with the light blocking pattern and the auxiliary electrode pattern and a second surface of the organic insulating pattern opposite of the first surface is a curved surface.

10. An electronic device comprising the electrode structure of claim 1.

11. A method of manufacturing the electrode structure of claim 1, the method comprising:

forming an electrode structure, in which the light blocking pattern, the auxiliary electrode pattern, and the organic insulating pattern are sequentially provided on the transparent electrode, wherein the forming of the electrode structure includes:

S1) forming the light blocking pattern and the auxiliary electrode pattern on the transparent electrode; and S2) forming an organic insulating pattern covering the light blocking pattern and the auxiliary electrode pattern, wherein operation S1 includes:

S1-1) forming a light blocking layer on the transparent electrode;

S1-2) forming an auxiliary electrode layer on the light blocking layer;

S1-3) forming an etching protecting pattern on the auxiliary electrode layer; and S1-4) forming the light blocking pattern and the auxiliary electrode pattern by removing portions of the light blocking layer and the auxiliary electrode layer where the etching protecting pattern is not present using an etching process that can be performed one or more times.

12. The method of claim 11, wherein operation S1-4) is an operation of forming the light blocking pattern and the auxiliary electrode pattern by removing the portions of the light blocking layer and the auxiliary electrode layer where the etching protecting pattern is not present using a one-time etching process using a collective etchant, and a line width of the light blocking pattern larger than a line width of the auxiliary electrode pattern is achieved by a difference in an etching speed of the light blocking layer and the auxiliary electrode layer with respect to the collective etchant.

13. The method of claim 11, wherein operation S2) includes:

S2-1) forming a photosensitive organic insulating layer in contact with the light blocking pattern and the auxiliary electrode pattern on the transparent electrode;

S2-2) irradiating the photosensitive organic layer with light to form an exposed photosensitive organic insulating layer;

S2-3) forming a precursor of the organic insulating pattern by developing the exposed photosensitive organic insulating layer; and S2-4) performing a reflow for forming the organic insulating pattern covering the light blocking pattern and the auxiliary electrode pattern by heating the precursor of the organic insulating pattern.

14. The method of claim 13, wherein in operation S2-4), a temperature for heating the precursor of the organic insulating pattern is from 130° C. to 250° C.

15. The method of claim 13, wherein operation S2) further includes S2-5) curing the organic insulating pattern.

16. A method of manufacturing the electrode structure of claim 1, the method comprising:

forming an electrode structure, in which the light blocking pattern, the auxiliary electrode pattern, and the organic insulating pattern are sequentially provided on the transparent electrode, wherein the forming of the electrode structure includes:

S1-1) forming a light blocking layer on the transparent electrode;

S1-2) forming an auxiliary electrode layer on the light blocking layer;

S1-3) forming an etching protecting pattern on the auxiliary electrode layer; and S1-4) forming the light blocking pattern and the auxiliary electrode pattern by removing portions of the light blocking layer and the auxiliary electrode layer where the etching protecting pattern is not present using a one-time etching process using a collective etchant;

S2-1) forming a photosensitive organic insulating layer in contact with the light blocking pattern and the auxiliary electrode pattern on the transparent electrode;

S2-2) irradiating the photosensitive organic layer with light to form an exposed photosensitive organic insulating layer;

S2-3) forming a precursor of the organic insulating pattern by developing the exposed photosensitive organic insulating layer;

S2-4) performing a reflow for forming the organic insulating pattern covering the light blocking pattern and the auxiliary electrode pattern by heating the precursor of the organic insulating pattern; and S2-5) curing the organic insulating pattern.

* * * * *